United States Patent [19]

Liss

[11] 4,418,971

[45] Dec. 6, 1983

[54] ELECTRICAL KEYING ARRANGEMENT

[75] Inventor: Warren A. Liss, Aurora, Ill.

[73] Assignee: Bell Telephone Laboratories, Incorporated, Murray Hill, N.J.

[21] Appl. No.: 289,761

[22] Filed: Aug. 3, 1981

[51] Int. Cl.[3] .................. H05K 1/02

[52] U.S. Cl. .................. 339/17 L; 339/147 R; 339/176 MP; 339/185 R

[58] Field of Search .................. 339/185, 147 R, 17 L, 339/176 MP, 184 M; 361/88

[56] References Cited

U.S. PATENT DOCUMENTS

| | | | |
|---|---|---|---|
| 2,908,775 | 10/1959 | Gilbert | 200/2 |
| 3,191,095 | 1/1961 | Hefti | 317/9 |
| 3,414,806 | 12/1968 | Carr | 324/65 |
| 3,634,816 | 1/1972 | Zell | 339/186 M |
| 3,710,197 | 1/1973 | Olds et al. | 317/118 |

*Primary Examiner*—Mark Rosenbaum
*Attorney, Agent, or Firm*—R. J. Godlewski

[57] ABSTRACT

An electrical keying arrangement ensures that correctly associated electrical components, such as a circuit board and connector, are interconnected by completing a conducting path which includes two pairs of keying terminals positioned on the components. One pair of uniquely spaced and positioned keying terminals on the edge of the circuit board are strapped together to complete the conducting path through the other pair of keying terminals when the board is inserted in the connector. The path is completed only when the connector keying terminals are similarly, uniquely spaced and positioned. When completed, the path may be utilized to energize a relay which controls the application of power to the circuit board.

11 Claims, 1 Drawing Figure

ELECTRICAL KEYING ARRANGEMENT

TECHNICAL FIELD

This invention relates generally to apparatus for electrically interconnecting electrical components and the like and, more particularly, to an electrical keying arrangement for ensuring that correctly associated electrical components are interconnected.

BACKGROUND OF THE INVENTION

Large electronic systems comprise many electrically interconnected components, including circuit boards and associated connector assemblies. Typically, each board carries a portion of an electronic circuit and has a plurality of terminals for making electrical contact with the terminals of other boards through the connector assemblies when the boards are inserted in the assemblies. Most systems use several nearly identically appearing boards which have different electrical characteristics, mounted in very close proximity to each other. In case of a circuit fault, the boards may be readily removed for repair or replacement and reinserted. Generally, each circuit board is designed for insertion in only one uniquely associated connector, since the insertion of a circuit board in an improper connector may cause damage both to the circuit board and the connector. Hence, a scheme for guarding against insertion of an improper circuit board, is highly desirable. In addition, when a circuit board is removed from a connector with power applied to the terminals, any resulting arcing may cause a transfer of metal between the board and connector terminals and the degradation of the electrical connection. Thus, a scheme which also prevents this arcing is even more desirable.

In the prior art, mechanical keying arrangements are often employed to ensure the correct insertion of circuit boards. In one typical mechanical keying arrangement, plug-in conducting elements are uniquely positioned on the leading edge of a board to ensure that the board is received only by the connector assembly which contains corresponding receptacle elements. This arrangement is limited by the number of conducting terminals that may be positioned on a circuit board for unique insertion in an associated connector. Another typical prior art mechanical keying arrangement involves the use of nonconducting means such as plugs and receptacles, ridges and grooves, and the like. These means may be molded into the board and connector assembly or mechanically attached to them. This arrangement is also limited in that the nonconducting means occupies space that may be utilized for additional electrical terminals. Furthermore, if at any time after initial installation a circuit board with a different keying arrangement is required in a particular mounting position, the connector assembly in the two previously mentioned prior art mechanical keying arrangements must be removed and replaced with a connector assembly having the new keying arrangement.

SUMMARY OF THE INVENTION

In accordance with this invention, an electrical keying arrangement ensures that correctly associated electrical components are interconnected by completing a conducting path. The conducting path includes a first pair of keying terminals on one component, and a second pair of keying terminals, corresponding in position to the first pair of terminals, on another component. When associated components are properly positioned with respect to each other a conducting path is completed which includes in sequence a terminal of the first pair, both terminals of the second pair, and the other terminal of the first pair.

In one illustrative electrical keying arrangement according to the invention, a pair of uniquely spaced and positioned keying terminals on the edge of a circuit board are strapped together. A conducting path can be completed only when the corresponding pair of terminals of the associated connector are similarly, uniquely spaced and positioned.

When associated components are properly positioned and the conducting path is completed, it may be utilized to energize a relay which controls the application of power to the components. The principles of the invention are extended to include a plurality of associated components such as circuit boards and associated connectors, each board having its own pair of strapped keying terminals which must match corresponding terminals in its connector to complete the conducting path. Thus, if one or more incorrect boards are inserted in the connectors, the conducting path is incomplete, and no power is applied to the boards. Advantageously, the keying arrangement in accordance with this invention requires minimal terminal space and requires no structural modification of a standard circuit board or connector. Advantageously, electrical damage to the board and the system is prevented since electrical power is applied only when all boards are correctly inserted. In accordance with yet another aspect of the invention, the keying terminals on each board may be interconnected through a switch which is actuated to the closed position when the board has been properly oriented and fully seated in the connector. Furthermore, to remove the board, the switch must be first actuated to the open position which removes power from the board, thereby preventing arcing between the connector and board terminals when the board is ultimately removed. Advantageously, this arrangement ensures that electrical power is applied only when all boards of a system are correctly and fully inserted. This arrangement also ensures that power is removed before a board is ultimately removed to prevent arcing between the board and connector terminals.

Advantageously, in accordance with the invention, the electrical keying arrangement with minimal terminal space ensures that correctly associated electrical components are interconnected.

BRIEF DESCRIPTION OF THE DRAWING

The invention may be better understood from the following detailed description when read with reference to the drawing which shows a representation of a plurality of circuit boards and connectors of an illustrative electrical keying arrangement in accordance with this invention.

DETAILED DESCRIPTION

Figure 1:
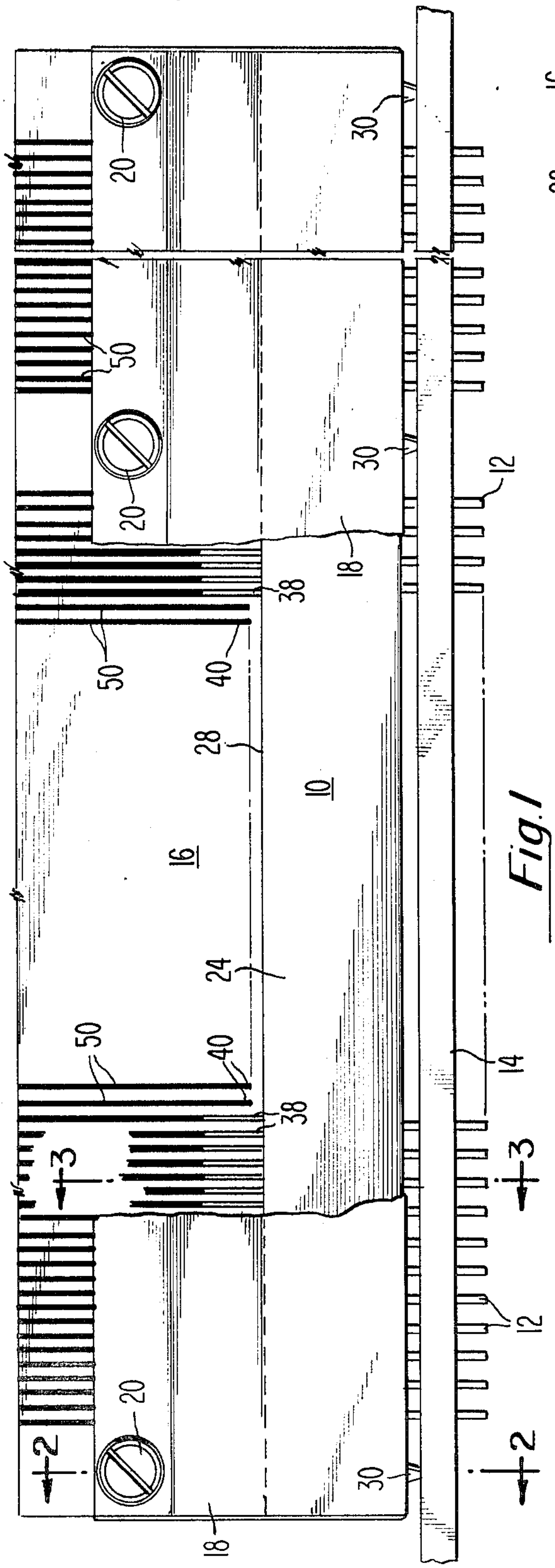

Shown in the drawing is an illustrative electrical keying arrangement for ensuring that a plurality of plug-in circuit boards $\mathbf{101}_1, \ldots \mathbf{101}_4$ is inserted in a corresponding plurality of associated connectors $\mathbf{102}_1, \ldots \mathbf{102}_4$ before power is applied to a power terminal on each board. Each electrical component in one plurality has a uniquely associated component in the other plurality. On each connector is an array of electrical terminals $103_1, \ldots 103_n$ which make contact with a corresponding array of electrical terminals $104_1, \ldots 104_n$ positioned on the associated board when the board is inserted in the connector. Each array of board terminals $104_1, \ldots 104_n$ includes a first and second or a pair of keying terminals uniquely spaced and positioned on the board. As depicted, terminals $104_3$ and $104_4$ on board $101_1$, terminals $104_1$ and $104_4$ on board $101_2$, terminals $104_1$ and $104_3$ on board $101_3$ and terminals $104_1$ and $104_2$ on board $101_4$ are all uniquely spaced and positioned keying terminals. Also, each array of board terminals including an additional terminal, power terminal $104_n$, for receiving a power signal. Similarly, each array of connector terminals $103_1, \ldots 103_n$ includes a power terminal $103_n$ and a third and fourth or corresponding pair of keying terminals respectively positioned to make contact with the power and keying terminals on the associated board. Such an arrangement of electrical terminals may be found on any number of well-known and commercially available socket type connectors for receiving the edge of a printed circuit board having correspondingly positioned terminals.

The electrical keying arrangement comprises a circuit, which includes a switch and a conducting path, for applying power to the circuit boards when the conducting path is completed. The switch controls the application of power to the inserted boards and may be, for example, any well-known relay which includes an armature coil 105 and a pair of relay contacts 108. When energized, the armature coil closes relay contacts 108 which in turn connect any well-known power source 106 to each connector power terminal $103_n$. Conductor 152 connects power source 106 to one relay contact, and conductor 153 connects the other contact to each connector power terminal $103_n$. When the correct circuit board is inserted in each connector, power source 106 is also connected to each board power terminal $104_n$. Conductor 151 connects the circuitry on each board to the board power terminal. One end of the relay armature coil is connected to one end of the conducting path, the other end of the coil connected to ground. When the conducting path is completed, power source 106, which is connected to the other end of the path, energizes the armature coil.

The conducting path includes each pair of keying terminals and is completed when the correct circuit board is inserted in each connector to connect, respectively, the first and second keying terminals on the board to the third and fourth keying terminals on the associated connector. If an improper board is inserted in any of the connectors, the two pairs of keying terminals will not match, and the conducting path is incomplete. Hence, no power is applied to the circuit boards. A well-known latching switch 109 on each board interconnects the board keying terminals when the board is properly aligned and fully seated in a connector. If any board is not inserted properly, the latching switch remains open, and the conducting path is incomplete. To remove a board, the latching switch must be first actuated to the open position which causes power to be removed from the board. The board may then be removed without any arcing between the connector and board terminals. The two latching switch contacts are connected to the two keying terminals on the board via conductors 154 and 155, respectively.

The conducting path also includes a power control switch 110 and a number of conductors which interconnect various connector keying terminals. Power control switch 110 may be any well-known manually operated switch and connects power source 106 to keying terminal $103_4$ on connector $102_1$. Conductors 156 and 157, respectively, connect the two contacts of the switch to the power source and the keying terminal. Keying terminal $103_1$ on connector $102_4$ is connected to one end of armature coil 105 via conductor 158. Each of the remaining connector keying terminals is interconnected to another keying terminal on another connector. Conductor 159 interconnects keying terminal $103_3$ on connector $102_1$ and keying terminal $103_4$ on connector $102_2$. Similarly, conductors 160 and 161 interconnect the keying terminals on connectors $102_2$, $102_3$, and $102_4$ as shown in the drawing. Hence, when the correct circuit board is inserted in each connector and power control switch 110 is closed, the conducting path is complete, and power source 106 is connected to each power terminal. If an improper board is inserted in any of the connectors or a switch remains open, the conducting path remains incomplete and damage to the circuitry on the boards or to the system of which the boards may be a part is prevented.

What has been described is only one specific illustrative embodiment of this invention, involving circuit boards and connectors. It is to be understood that various and numerous other arrangements for ensuring that correctly associated electrical components are interconnected may be devised by one skilled in the art without departing from the spirit and scope of the invention as limited only by the accompanying claims.

What is claimed is:

1. An electrical keying arrangement for preventing electrical arcing and related damage when a first and a second electrical component are interconnected, said first and second components being associated, comprising:

a first and a second keying terminal positioned on said first component;

a third and a fourth keying terminal positioned on said second component, said third and said fourth keying terminals corresponding respectively in position to said first and said second keying terminals;

switch means operative to interconnect said third and said fourth keying terminals only when said first and said second components are positioned in a predetermined manner to connect respectively said first and said second to said third and said fourth keying terminals; and a conducting path including in sequence said first and said third keying terminals, said switch means, and said fourth and said second keying terminals and being completed when said components are positioned in said predetermined manner and when said switch means is operated to interconnect said third and said fourth keying terminals.

2. An electrical keying arrangement for preventing electrical arcing and related damage when a first and a second plurality of electrical components are interconnected, each component in one having an associated component in the other of said first and second pluralities of electrical components; said arrangement comprising:

a first and a second keying terminal positioned on each component of said first plurality of electrical components, the first and the second keying terminals on particular components of said first plurality of electrical components being uniquely spaced and positioned;

a third and a fourth keying terminal positioned on each component of said second plurality of electrical components, the third and the fourth keying terminals on each component of said second plurality of electrical components corresponding respectively in position to the first and the second keying terminals on the associated component of said first plurality of electrical components;

switch means operative to interconnect the third and the fourth keying terminals on at least one selected component of said second plurality of electrical components only when said selected component and the associated component of said first plurality of electrical components are positioned in a predetermined manner to connect respectively the third and the fourth keying terminals on said selected component to the first and the second keying terminals on the associated component of said first plurality of electrical components; and a conducting path including in sequence the first and the third keying terminals, said switch means, and the fourth and the second keying terminals of said selected component and the first, the third, the fourth, and the second keying terminals of each of the remaining components of said first and said second plurality of electrical components and being completed when the components of said first and said second pluralities of electrical components are positioned in said predetermined manner to connect respectively the first and the second keying terminals on each component of said first plurality of electrical components to the third and the fourth keying terminals on the associated component of said second plurality of electrical components and when said switch means is operated to interconnect the third and the fourth keying terminals on said selected component.

3. An electrical keying arrangement for preventing electrical arcing and related damage when a first and a second electrical component are interconnected, said first and second components being associated, comprising:

a first and a second keying terminal positioned on said first component;

a third and a fourth keying terminal positioned on said second component, said third and said fourth keying terminals corresponding respectively in position to said first and said second keying terminals;

an additional terminal positioned on at least one of said components;

switch means operative to interconnect said third and said fourth keying terminals only when said first and said second components are positioned in a predetermined manner to connect respectively said first and said second to said third and said fourth keying terminals;

a conducting path including said keying terminals and said switch means; and circuit means for applying a signal to said additional terminal when said conducting path is completed, said path being completed when said components are positioned in said predetermined manner and when said switch means is operated to interconnect said third and said fourth keying terminals.

4. An electrical keying arrangement in accordance with claim 3, in which said circuit means comprises relay means having a relay coil connected to said conducting path and relay contacts connected to said additional terminal, said relay coil being energizable to close said contacts when said conducting path is complete.

5. An electrical keying arrangement in accordance with claim 4, in which said circuit means comprises second switch means connected to said conducting path for energizing said relay coil to close said relay contacts when said conducting path is completed.

6. An electrical keying arrangement for preventing electrical arcing and related damage when a first and a second plurality of electrical components are interconnected, each component in one having an associated component in the other of said first and second pluralities of electrical components; said arrangement comprising:

a first and a second keying terminal positioned on each component of said first plurality of electrical components, the first and the second keying terminals on particular components of said first plurality of electrical components being uniquely spaced and positioned;

a third and fourth keying terminal positioned on each component of said second plurality of electrical components, the third and the fourth keying terminals on each component of said second plurality of electrical components corresponding respectively in position to the first and the second keying terminals on the associated component of said first plurality of electrical components;

an additional terminal positioned on at least one component of said first and second pluralities of electrical components;

switch means operative to interconnect the keying terminals on at least one selected component of said first and second pluralities of electrical components only when said selected component and its associated component are positioned in a predetermined manner to connect respectively the keying terminals on said selected component to the keying terminals on its associated component; and a conducting path including the first, second, third, and fourth keying terminals on said first and second pluralities of electrical components and said switch means; and circuit means for applying a signal to said additional terminal when said conducting path is completed, said path being completed when the components of said first and second pluralities of electrical components are positioned in said predetermined manner to connect respectively the first and the second keying terminals on each component of said first plurality of electrical components to the third and fourth keying terminals on the associated component of said second plurality of electrical components and when said switch means is operated to interconnect the keying terminals on said selected component.

7. An electrical keying arrangement in accordance with claim 6, in which said circuit means comprises relay means having a relay coil connected to said conducting path and relay contacts connected to said additional terminal, said relay coil being energizable to close said contacts when said conducting path is completed.

8. An electrical keying arrangement in accordance with claim 7, in which said circuit means comprises switch means connected to said conducting path for energizing said relay coil to close said relay contacts when said conducting path is completed.

9. An electrical keying arrangement for preventing electrical arcing and related damage when a circuit board is inserted in an associated connector; comprising:

a first plurality of keying terminals positioned on said connector;

a second plurality of keying terminals positioned on said board, said second plurality of keying terminals corresponding in position to said first plurality of keying terminals;

an additional terminal positioned on at least one of said board and said connector;

switch means operative to interconnect predetermined ones of said keying terminals on said board only when said board is inserted in said associated connector;

a conducting path including said predetermined keying terminals, the keying terminals on said connector corresponding in position to predetermined keying terminals on said board, and said switch means; and circuit means for applying an electrical signal to said additional terminal when said conducting path is completed when said board is inserted in said associated connector and when said switch means is operated to interconnect said predetermined keying terminals.

10. An electrical keying arrangement in accordance with claim 9, wherein said circuit means comprises relay means having a relay coil connected to said conducting path and relay contacts connected to said additional terminal, said relay coil being energizable to close said contacts when said circuit path is completed.

11. An electrical keying arrangement in accordance with claim 10 in which said circuit means further comprises switch means connected to said circuit path for energizing said relay coil to close said relay contacts when said conducting path is completed.

* * * * *

UNITED STATES PATENT AND TRADEMARK OFFICE
CERTIFICATE OF CORRECTION

PATENT NO. : 4,418,971

DATED : December 6, 1983

INVENTOR(S) : Warren A. Liss

It is certified that error appears in the above-identified patent and that said Letters Patent is hereby corrected as shown below:

The title page should be deleted to appear as per attached title page.

Figure 4:
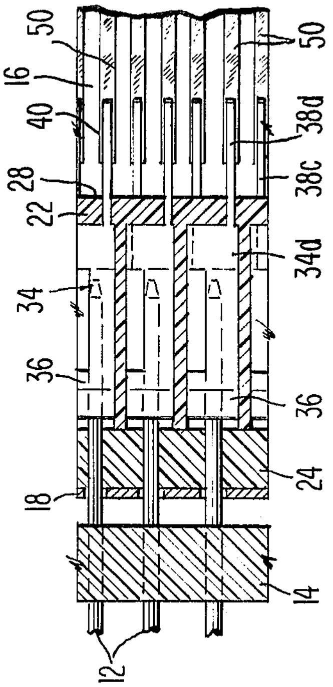
Figure 2:
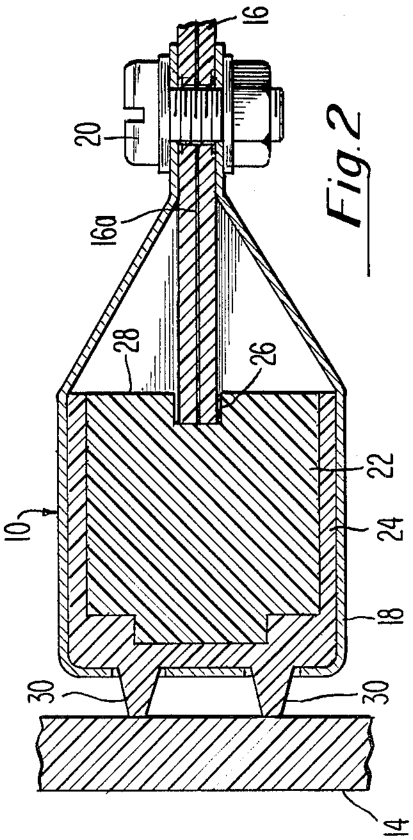
Figure 3:
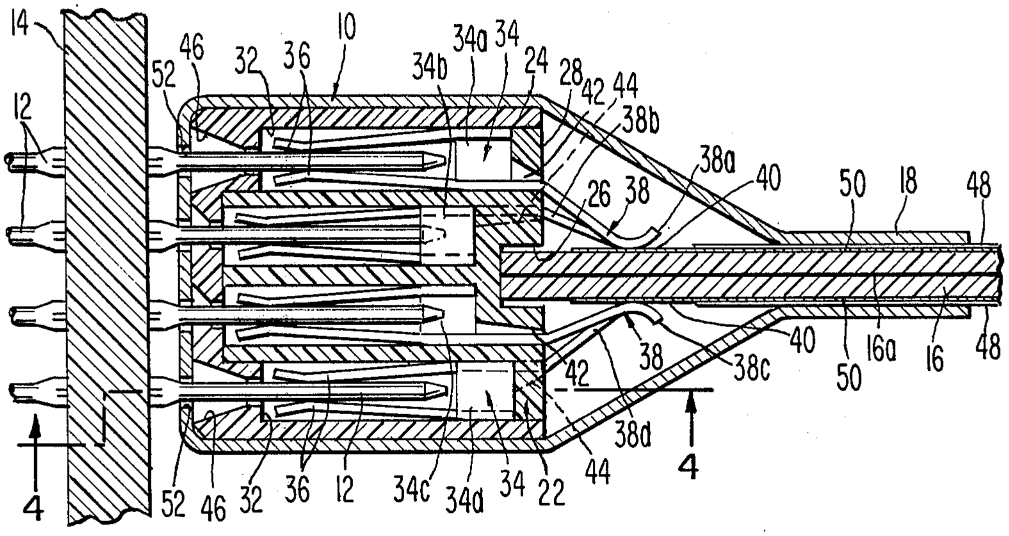
Figure 5:
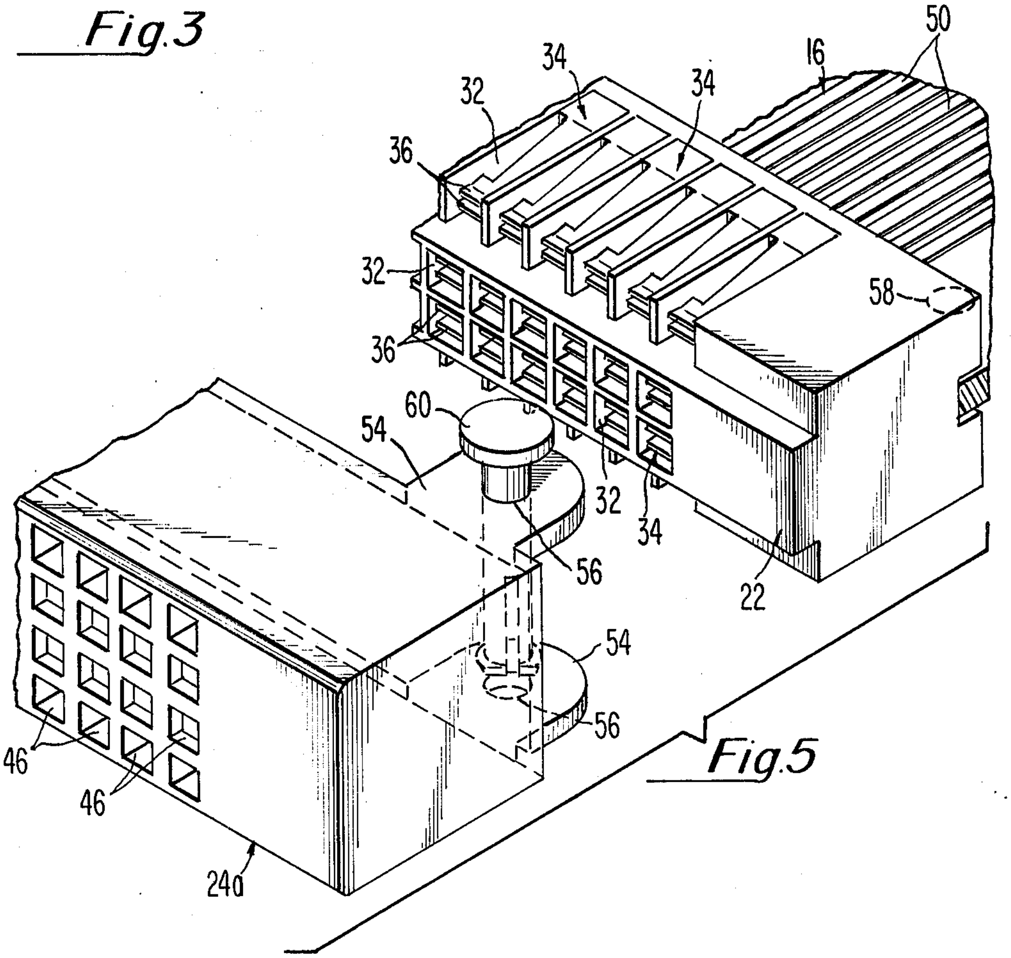

The sheets of drawings consisting of Figs. 1-5 should be deleted to appear as per the attached sheet.

Signed and Sealed this

*Fourth* Day of *September 1984*

[SEAL]

*Attest:*

GERALD J. MOSSINGHOFF

*Attesting Officer* *Commissioner of Patents and Trademarks*

United States Patent [19]

Liss

[11] 4,418,971

[45] Dec. 6, 1983

[54] ELECTRICAL KEYING ARRANGEMENT

[75] Inventor: Warren A. Liss, Aurora, Ill.

[73] Assignee: Bell Telephone Laboratories, Incorporated, Murray Hill, N.J.

[21] Appl. No.: 289,761

[22] Filed: Aug. 3, 1981

[51] Int. Cl.[3] .................... H05K 1/02

[52] U.S. Cl. .................... 339/17 L; 339/147 R; 339/176 MP; 339/185 R

[58] Field of Search .................... 339/185, 147 R, 17 L, 339/176 MP, 184 M; 361/88

[56] References Cited

U.S. PATENT DOCUMENTS

| | | | |
|---|---|---|---|
| 2,908,775 | 10/1959 | Gilbert | 200/2 |
| 3,191,095 | 1/1961 | Hefti | 317/9 |
| 3,414,806 | 12/1968 | Carr | 324/65 |
| 3,634,816 | 1/1972 | Zell | 339/186 M |
| 3,710,197 | 1/1973 | Olds et al. | 317/118 |

*Primary Examiner*—Mark Rosenbaum
*Attorney, Agent, or Firm*—R. J. Godlewski

[57] ABSTRACT

An electrical keying arrangement ensures that correctly associated electrical components, such as a circuit board and connector, are interconnected by completing a conducting path which includes two pairs of keying terminals positioned on the components. One pair of uniquely spaced and positioned keying terminals on the edge of the circuit board are strapped together to complete the conducting path through the other pair of keying terminals when the board is inserted in the connector. The path is completed only when the connector keying terminals are similarly, uniquely spaced and positioned. When completed, the path may be utilized to energize a relay which controls the application of power to the circuit board.

11 Claims, 1 Drawing Figure

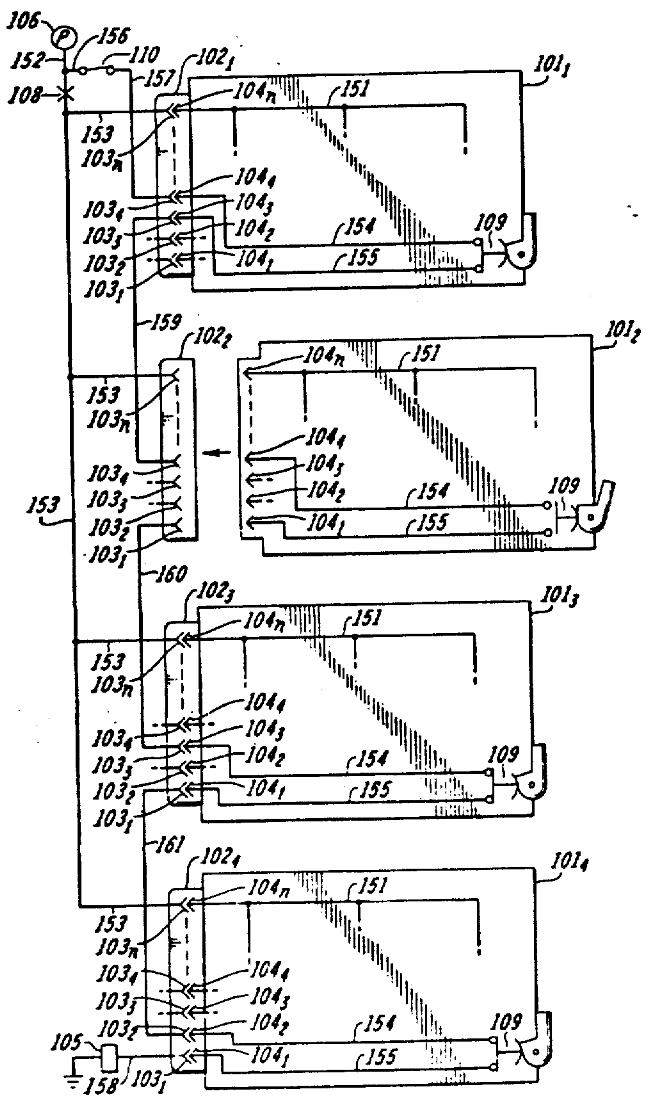

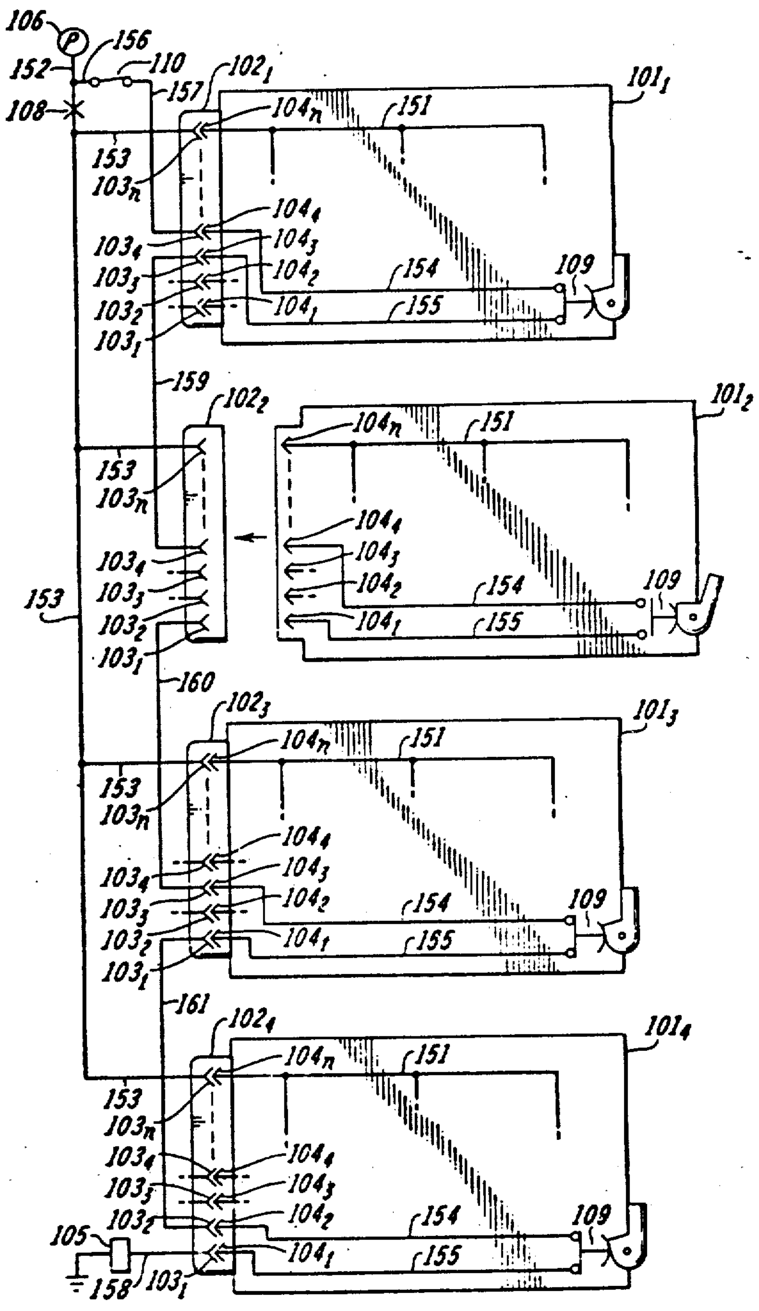
106
P
156
110
152
108
157
102₁
101₁
104n
151
153
103n
104₄
104₃
103₄
103₃
104₂
154
109
103₂
104₁
155
103₁
159
102₂
101₂
160
102₃
101₃
161
102₄
101₄
105
158